United States Patent [19]
Hu

[11] Patent Number: 5,530,675
[45] Date of Patent: *Jun. 25, 1996

[54] FLOATING GATE NONVOLATILE MEMORY WITH UNIFORMLY ERASED THRESHOLD VOLTAGE

[75] Inventor: Genda J. Hu, Sunnyvale, Calif.

[73] Assignee: Cypress Semiconductor Corp., San Jose, Calif.

[*] Notice: The term of this patent shall not extend beyond the expiration date of Pat. No. 5,424,991.

[21] Appl. No.: 442,682

[22] Filed: May 17, 1995

Related U.S. Application Data

[63] Continuation of Ser. No. 30,458, Apr. 1, 1993, Pat. No. 5,424,991.

[51] Int. Cl.$^6$ .............................. G11C 7/00; G11C 29/00
[52] U.S. Cl. ................ 365/218; 365/185.30; 365/185.24
[58] Field of Search ..................................... 365/218, 185, 365/900, 185.24, 185.30

[56] References Cited

U.S. PATENT DOCUMENTS

| 4,460,982 | 7/1984 | Gee et al. | 365/104 |
|---|---|---|---|
| 4,636,983 | 1/1987 | Young et al. | 365/181 |
| 4,875,188 | 10/1989 | Jungroth | 365/185 |
| 4,954,990 | 9/1990 | Vider | 365/189.01 |
| 5,122,985 | 6/1992 | Santin | 365/218 |
| 5,132,935 | 7/1992 | Ashmore, Jr. | 365/218 |
| 5,142,495 | 8/1992 | Canepa | 365/189.09 |
| 5,172,338 | 12/1992 | Mehrotra et al. | 365/201 |
| 5,233,562 | 8/1993 | Ong et al. | 365/218 |
| 5,272,669 | 12/1993 | Samachisa et al. | 365/185 |
| 5,295,107 | 3/1994 | Okazawa et al. | 365/218 |
| 5,424,991 | 6/1995 | Hu | 365/218 |

OTHER PUBLICATIONS

Takeshi Nakayama et al., "A 60ns 16Mb Flash EEPROM with Program and Erase Sequence Controller," IEEE International Solid–State Circuits Conference, FPM 16.1, pp. 260–261 (1991).

Primary Examiner—Tan T. Nguyen
Attorney, Agent, or Firm—Blakely, Sokoloff, Taylor & Zafman

[57] ABSTRACT

A method is described for eliminating overerasure in a nonvolatile memory that includes a plurality of memory cells, each having a control gate, a floating gate, a drain, and a source. The nonvolatile memory is electrically erased until each of the plurality of memory cells has a threshold voltage below a predetermined erased voltage state. The nonvolatile memory then undergoes an equalization programming operation by applying an equalization programming voltage to the control gate of each of the plurality of memory cells such that the threshold voltage of each of the plurality of memory cells is saturated to the predetermined erased voltage state. The equalization programming voltage determines the predetermined erased voltage state. An apparatus for eliminating overerasure in the nonvolatile memory during erasing is also described.

22 Claims, 8 Drawing Sheets

FLOATING GATE NONVOLATILE MEMORY WITH UNIFORMLY ERASED THRESHOLD VOLTAGE

This application is a continuation of U.S. patent application Ser. No. 08/030,458, filed Apr. 1, 1993, now U.S. Pat. No. 5,424,991.

FIELD OF THE INVENTION

The present invention pertains to the field of computer memories. More particularly, this invention relates to a floating gate nonvolatile memory, wherein its memory cells have a uniformly minimized enhancement type threshold voltage after erasure.

BACKGROUND OF THE INVENTION

Metal-oxide-semiconductor ("MOS") electrically programmable read-only memories ("EPROMs") frequently use memory cells that have electrically isolated gates (floating gates). Information is stored in the memory cells in the form of charge on the floating gates.

One type of prior EPROM is the flash erasable and programmable read-only memory ("flash EPROM"). A typical flash EPROM has the same array configuration as a standard EPROM. The array is thus organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to a common source line. The flash EPROM can be programmed by a user, and once programmed, the flash EPROM retains its data until erased. Once programmed, the entire contents of the flash EPROM can be erased by electrical erasure. A high erasing voltage is made available to the sources of all the cells in the flash EPROM simultaneously. This results in a full array erasure. The flash EPROM may then be reprogrammed with new data.

Electrically erasing floating gate flash EPROM cells typically gives rise to a serious problem, specifically undererasing and overerasing. During an erasure operation, some memory cells may not be completely erased, leaving those cells still in a programmed-like state. Conversely, too much charge may be removed from some other memory cells, making those cells "depletion-like."

One prior art solution to solving this problem is to verify that the floating gate of each of the memory cells in the flash EPROM is properly erased during the erasure operation. Typically, the high erasure voltage is pulsed such that the memory cells can be verified between the high erasure voltage pulses. When at least one of the memory cells has a very low threshold voltage, the erasure operation is terminated.

One disadvantage of the prior art solution is that such erasure and erasure verify cycle typically takes long time to finish the erasure operation. In order to prevent the memory cells from being over-erased, the width of the erasure voltage pulse needs to be small and the erasure verify sequence needs to be frequently and repeatedly applied between the erasure voltage pulses. This typically prolongs the erasure operation.

Another disadvantage is that the threshold voltage of each of the memory cells in the flash EPROM varies from memory cell to memory cell after the erasure operation. Due to various variations, such as temperature variation, process variation, and voltage supply variation, the memory cells typically cannot be erased to have a uniform threshold voltage. Typically, the threshold voltages of the memory cells range from 0.7 volts to 3 or 3.5 volts after each erasure operation. This typically affects the speed of the flash EPROM during the subsequent read operations. In addition, such flash EPROM cannot be used in a low power supply environment as a 3 volt power supply will not select an erased memory cell with a 3.5 volt threshold voltage during the read operation.

Moreover, as the flash EPROM experiences more and more program-erase cycles, the difference between the lowest threshold voltage and the highest threshold voltage in the flash EPROM after an erasure operation will increase accordingly. If the erasure sequence is set such that the erasure operation is terminated when any one of the memory cells within the flash EPROM reaches the predetermined lowest threshold voltage, then the flash EPROM will typically become unusable to the user after certain programming erasure cycles.

SUMMARY AND OBJECTS OF THE INVENTION

One object of the present invention is to provide apparatus and a method of eliminating overerasure in a floating gate nonvolatile memory.

Another object of the present invention is to provide apparatus and a method of eliminating overerasure in a floating gate nonvolatile memory, wherein the threshold voltage of the memory cells of the nonvolatile memory is uniformly erased after each erasure operation.

Another object of the present invention is to provide apparatus and a method of eliminating overerasure in a floating gate nonvolatile memory, wherein the speed of the nonvolatile memory is maximized.

Another object of the present invention is to provide apparatus and a method of eliminating overerasure in a floating gate nonvolatile memory such that the memory can be safely used in a low power supply environment.

A further object of the present invention is to provide apparatus and a method of eliminating overerasure in a floating gate nonvolatile memory, wherein the erasure time of the floating gate nonvolatile memory is minimized.

A method is described for eliminating overerasure in a nonvolatile memory that includes a plurality of memory cells, each having a control gate, a floating gate, a drain, and a source. The nonvolatile memory is first preconditioned by selectively programming some of the plurality of memory cells such that each of the plurality of memory cells is in a programmed state. The nonvolatile memory is then erased by applying an erasure voltage to the source of each of the plurality of memory cells until each of the plurality of memory cells has a threshold voltage below a predetermined erased voltage state. The control gate of each of the plurality of memory cells is coupled to ground during erasing. Alternatively, the erasure operation is achieved by applying negative high voltage to the control gate and positive voltage to the source. The nonvolatile memory then undergoes the second part of the erasure operation which is an equalization programming operation by applying an equalization programming voltage to the control gate of each of the plurality of memory cells such that the threshold voltage of each of the plurality of memory cells is saturated to the predetermined final erased voltage state. The equalization programming voltage determines the predetermined final erased voltage state. During the equalization programming operation, the drain of each of the plurality of memory cells is coupled to a programming drain voltage and the source of each of the plurality of memory cells is coupled to the ground.

An apparatus for eliminating overerasure in the nonvolatile memory during erasing is also described. The apparatus includes a circuit for preconditioning the nonvolatile memory by selectively programming some of the plurality of memory cells such that each of the plurality of memory cells is in a programmed state. A circuit is provided for erasing the nonvolatile memory after pre-conditioning until each of the plurality of memory cells has a threshold voltage below a predetermined erased voltage state. A circuit is also provided for performing an equalization programming operation to the nonvolatile memory by applying an equalization programming voltage to the control gate of each of the plurality of memory cells such that the threshold voltage of each of the plurality of memory cells is saturated to the predetermined erased voltage state. The equalization programming voltage determines the predetermined final erased voltage state. During the equalization programming operation, the drain of each of the plurality of memory cells is coupled to a drain programming voltage and the source of each of the plurality of memory cells is coupled to the ground.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A flash EPROM includes a memory array. The memory array is comprised of a plurality of floating gate memory cells. The memory cells are organized into columns and rows. According to one embodiment of the present invention, the memory cells of the flash EPROM are erased to a uniformly low enhancement threshold voltage.

Figure 1:
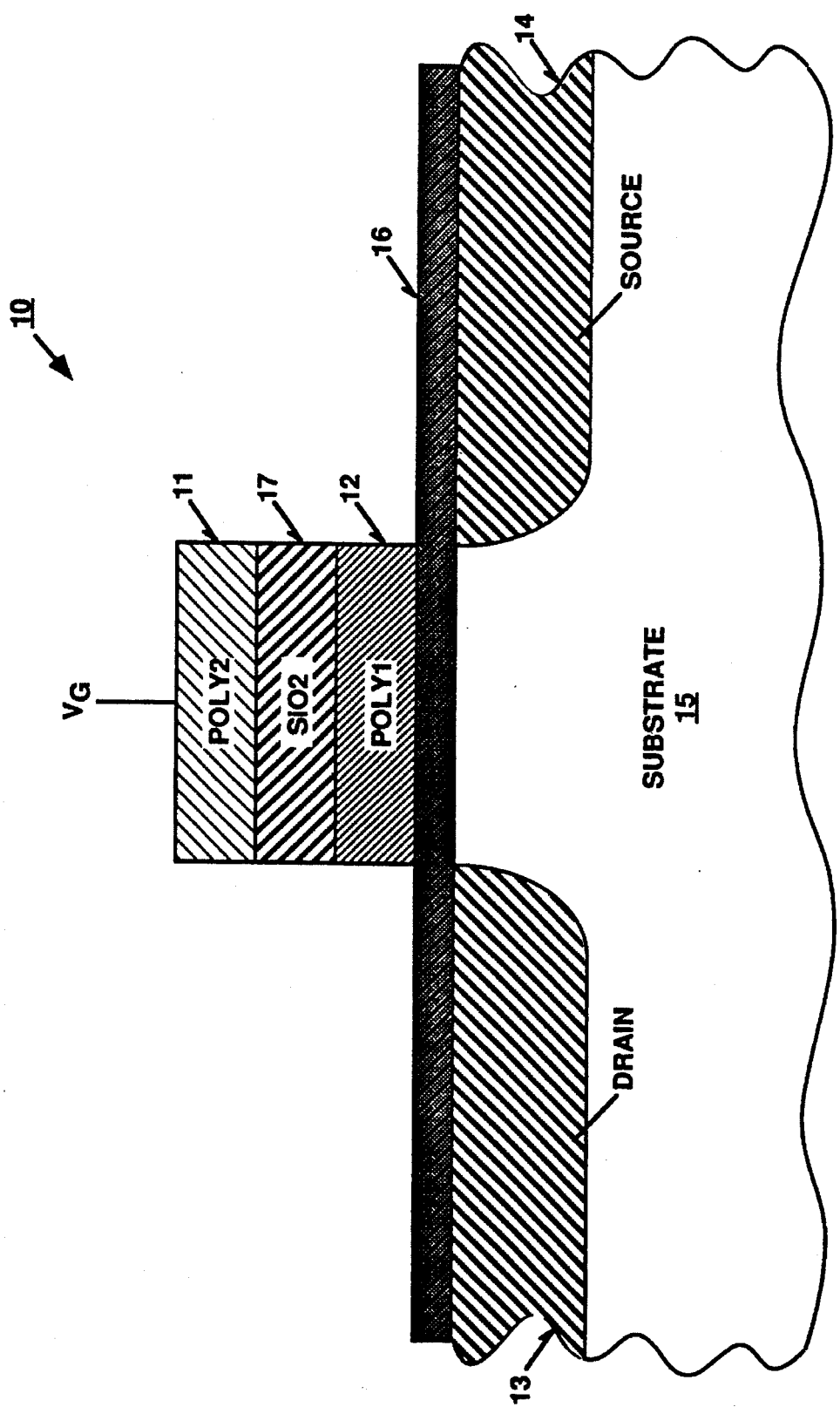
FIG. 1 is a schematic diagram of a floating gate memory cell of a flash EPROM.

FIG. 1 shows a floating gate memory cell 10 that is included in the flash EPROM of the present invention. Memory cell 10 is formed on a silicon substrate 15. In one embodiment, substrate 15 is a P-type substrate. Memory cell 10 is shown in FIG. 1 in a partially fabricated state because this best reveals its structure.

Memory cell 10 includes a pair of spaced-apart doped regions disposed in the substrate—namely, a drain region 13 and a source region 14. A polysilicon floating gate 12 is generally disposed above and between these regions and insulated from these regions by an insulating layer 16. Floating gate 12 at the completion of the processing is completely surrounded by insulating layers and hence, electrically floats. A second gate (control gate) 11 is disposed above the floating gate 12. In one embodiment, this gate is fabricated from a second layer of polysilicon. A second insulating layer 17 separates floating gate 12 with the control gate 11. Control gate 11 is a continuous polysilicon strip that forms a word line for the memory array in which cell 10 resides.

Memory cell 10 is programmed (i.e., negatively charging the floating gate) by coupling control gate 11 to a positive potential, drain region 13 to a potential of approximately +7 volts, and source region 14 to ground. For one embodiment, the positive potential is approximately +12 volts. Under these conditions, channel hot electron injection occurs through the oxide layer 16. The electrons deposited on floating gate 12 of memory cell 10 causes the threshold voltage of memory cell 10 to be raised. In this case, memory cell 10 has a programmed threshold voltage.

To erase cell 10, drain region 13 is floated, control gate 11 is grounded and a potential of approximately +12 volts is applied to source region 14. Under these conditions, charge is tunneled from floating gate 12 to source region 14. This typically removes the electrons deposited on floating gate 12 of memory cell 10, causing the threshold voltage of memory cell 10 to be decreased. In this case, memory cell 10 has an erased threshold voltage.

To read cell 10, a positive read potential less than that which would cause charge to transfer onto floating gate 12 is applied to control gate 11 (e.g., 5 volts) and a potential (e.g., 1 volt) is applied to drain region 13. Current through the device is sensed to determine if floating gate 12 is or is not negatively charged.

Figure 2:
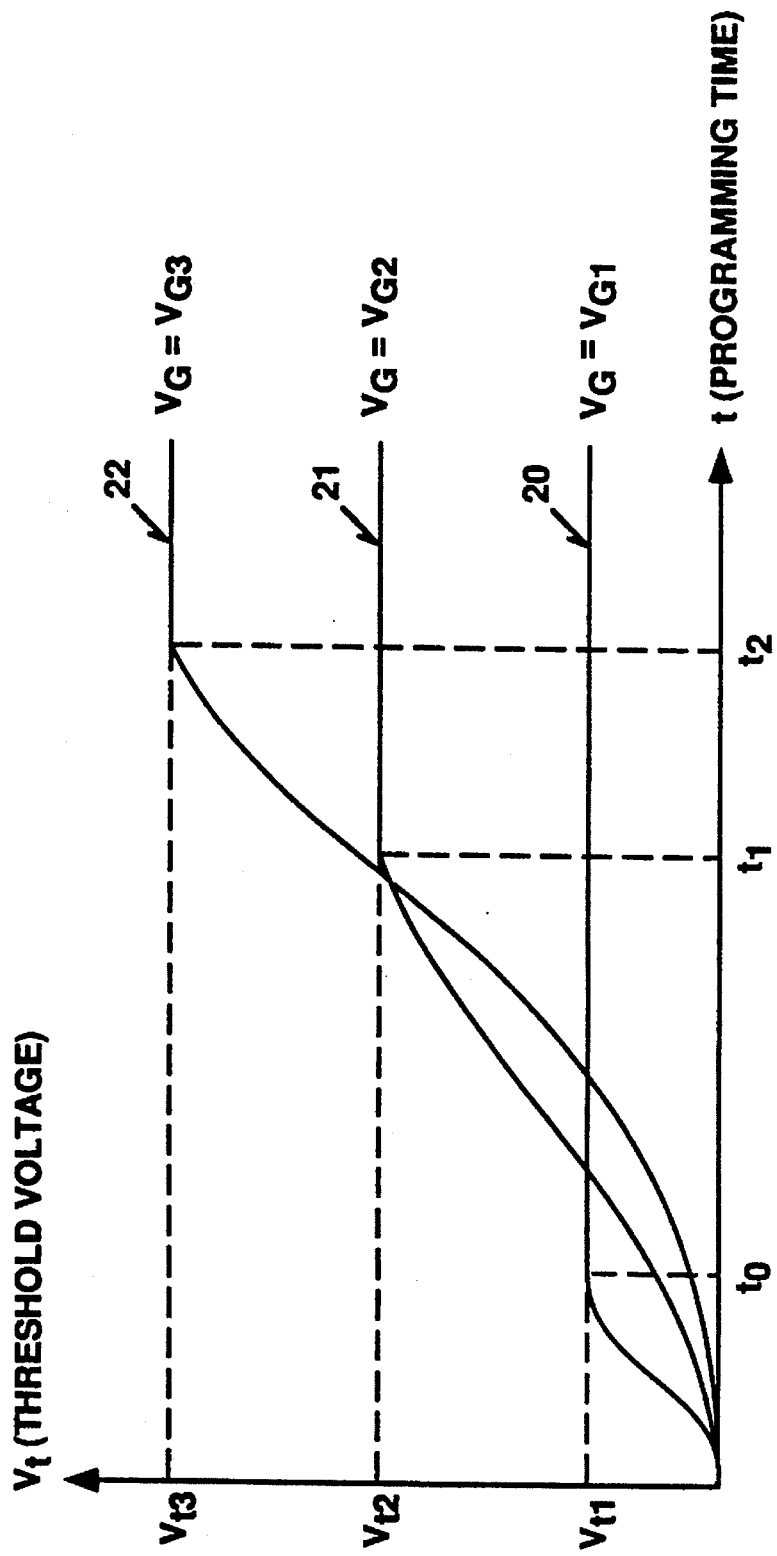
FIG. 2 is a voltage-time diagram illustrating the threshold voltage of the memory cell of FIG. 1 with respect to a programming voltage applied to control gate of the memory cell and the programming time of the memory cell.

Memory cell 10 can be electrically programmed to have various threshold voltages by applying different programming gate voltages to control gate 11 of memory cell 10 during programming. This is due to the fact that the threshold voltage of a memory cell is saturated to a voltage which is solely determined by the programming gate voltage applied at its control gate during programming, regardless of the initial threshold voltage state before programming. FIG. 2 illustrates the relationship of the threshold voltage of memory cell 10 with respect to the programming gate voltage applied at control gate 11 of memory cell 10 as a function of time, which will be described below.

As can be seen from FIG. 2, after certain programming time, the threshold voltage of memory cell 10 of FIG. 1 becomes saturated to a voltage level which is determined by the programming gate voltage $V_G$ applied at control gate 11 of memory cell 10. When the programming gate voltage $V_G$ is at a $V_{G1}$ voltage, the threshold voltage of memory cell 11 is saturated to a $V_{t1}$ voltage (curve 20). When the programming gate voltage $V_G$ is at a $V_{G2}$ voltage, the threshold voltage of memory cell is then saturated to a $V_{t2}$ voltage (curve 21). When the programming gate voltage $V_G$ is at a $V_{G3}$ voltage, the threshold voltage of memory cell 10 is then saturated to a $V_{t3}$ voltage (curve 22). Therefore, the voltage level of the threshold voltage of memory cell 10 can be controlled by controlling the programming gate voltage $V_G$ applied at the control gate of memory cell 10.

Figure 3:
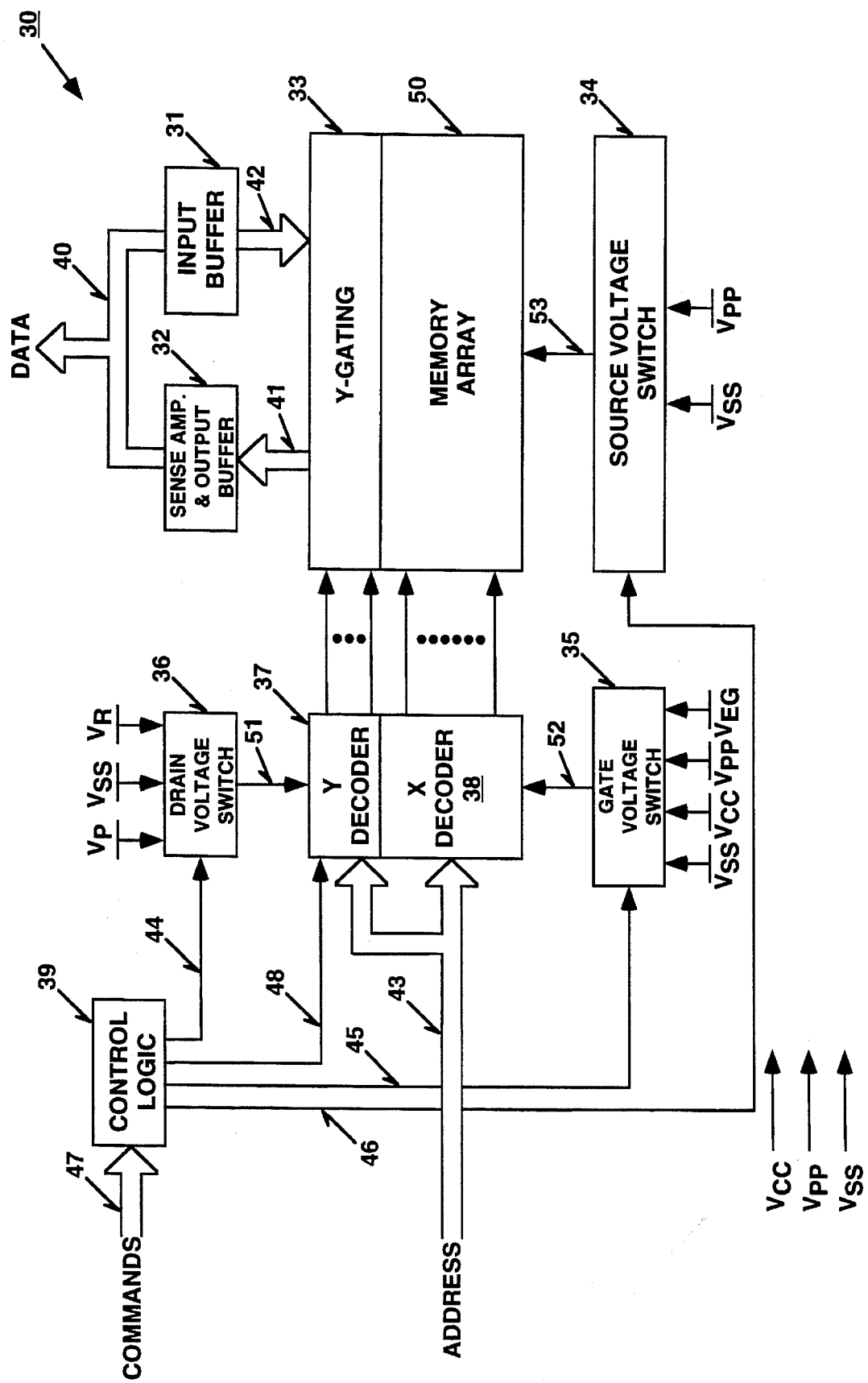
FIG. 3 is a block diagram of the layout of a flash EPROM, which implements an embodiment of the present invention.
Figure 5A:
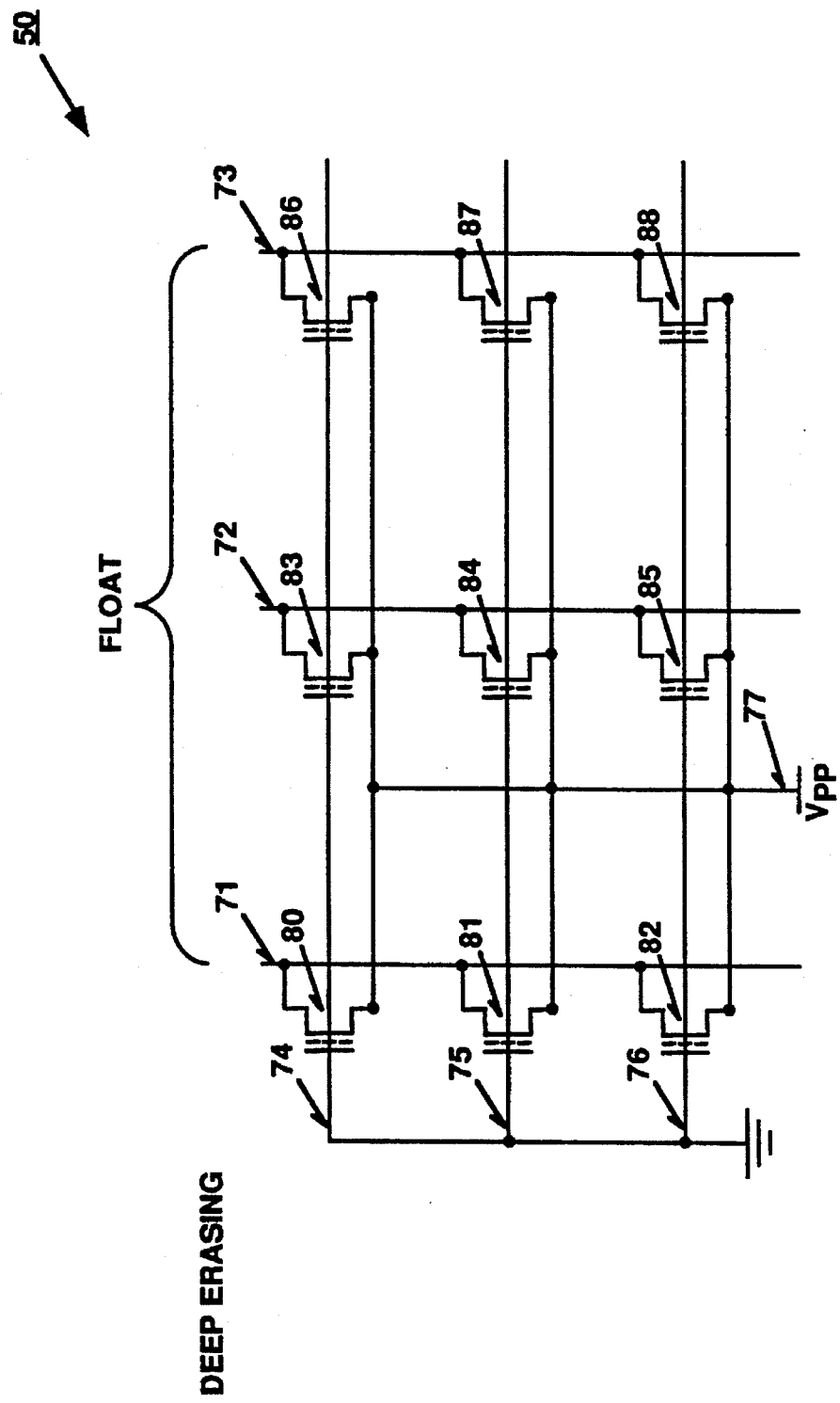
FIG. 5A schematically shows the memory array of the flash EPROM of FIG. 3 and the potentials applied to the cells during erasing.
Figure 5B:
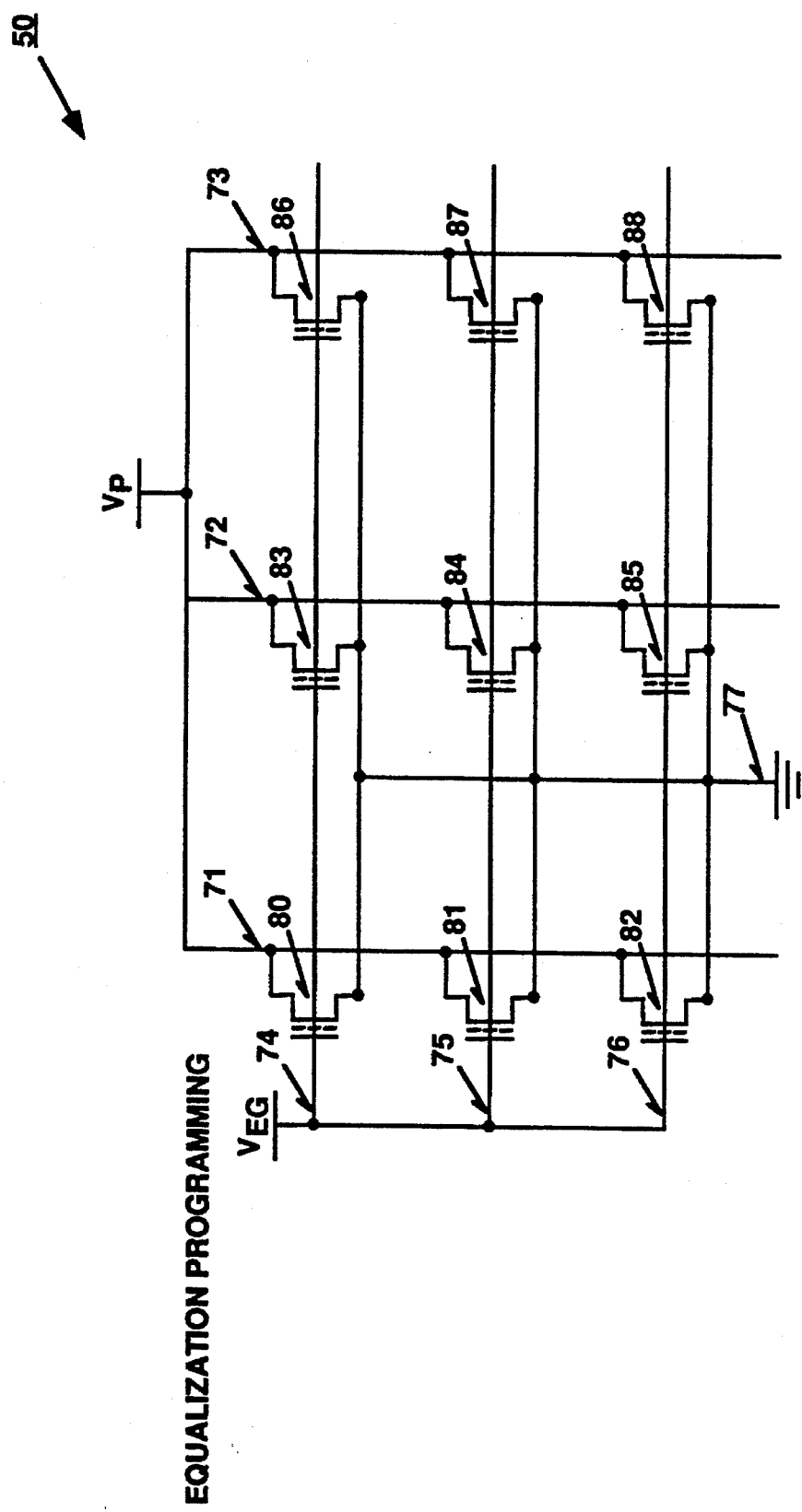
FIG. 5B shows the potentials applied to the memory array of FIG. 3 during equalization programming, according to the embodiment of the present invention.
Figure 5C:
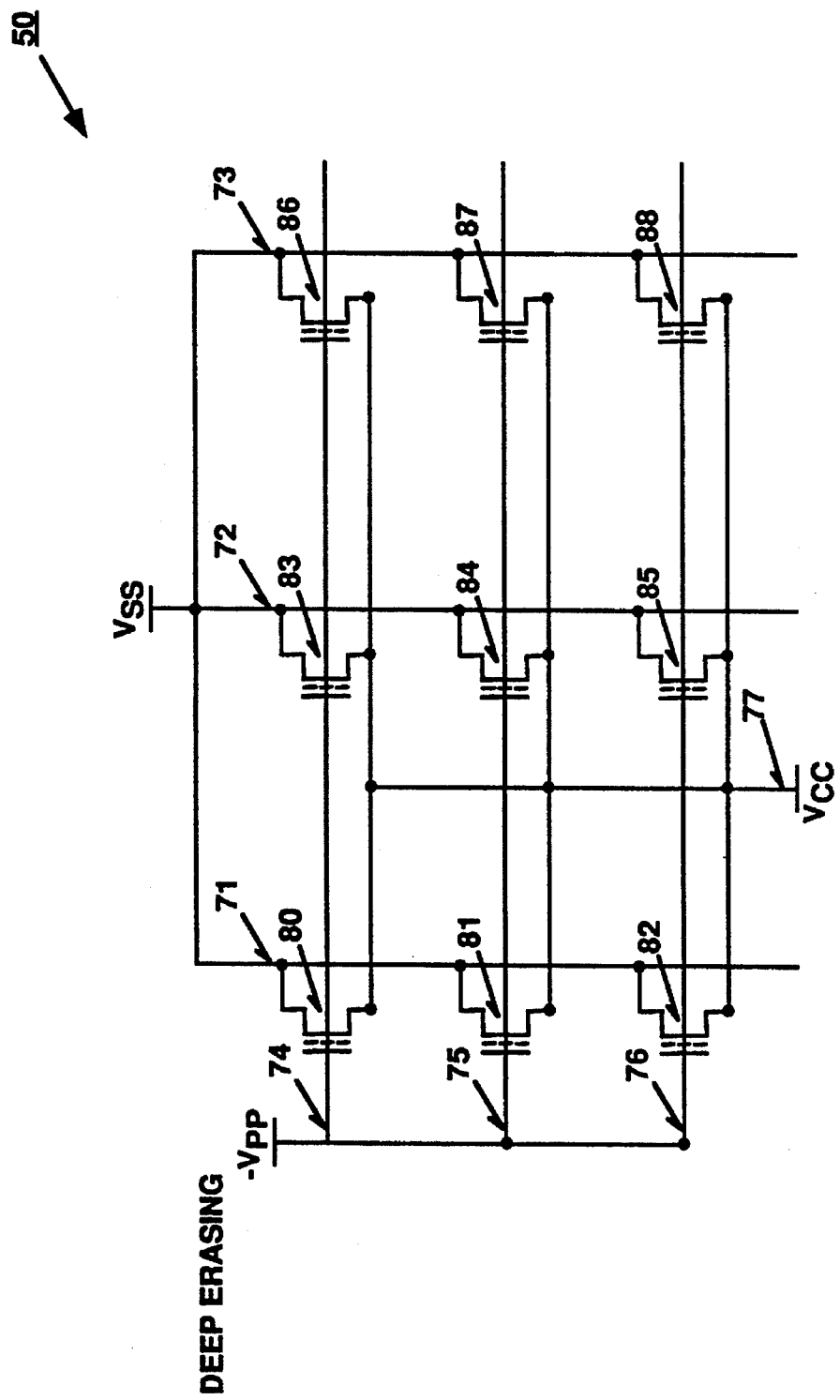
FIG. 5C schematically illustrates another embodiment of erasing the memory array of FIG. 3 and the potentials applied to the cells during erasing.

FIG. 3 illustrates in block diagram form the layout of a flash EPROM 30, which implements one embodiment of the present invention. Flash EPROM 30 can be read, programmed, and erased electrically. Flash EPROM 30 includes a memory array 50, which is made up of memory cells (not shown) that store data at addresses. Each of the memory cells of memory array 50 can be memory cell 10 of FIG. 1. In one embodiment, memory array 50 can store 2 MB (i.e., megabit) of data. In alternative embodiments, memory array 50 can be larger or smaller than 2 MB. In one embodiment, flash EPROM 30 employs CMOS circuitry. FIGS. 5A–5C, schematically illustrate the array configuration of memory array 50, which will be described in more detail below.

Referring to FIGS. 5A–5C, only nine memory cells 80 through 88 are shown for memory array 50 for illustration purposes only. In practice, many more memory cells are used. As shown in FIGS. 5A–5C, memory array 50 includes bit lines 71 through 73, word lines 74 through 76, and a common source line 77. Memory cells 80–88 are formed at intersections of word lines 74–76 and bit lines 71–73. Each of memory cells 80–88 has its control gate coupled to a word line and its drain coupled to a bit line. The source of each of memory cells 80–88 is coupled to common source line 77. Each of memory cells 80–88 of memory array 50 is initially in the erased state after fabrication. Memory cells 80–88 of memory array 50 store data in binary form. Each of memory cells 80–88 can be programmed to store logical zero and can be erased to store logical one. Memory array 50 can be programmed after each erasure operation. Depending on the data to be stored, a memory cell of memory array 50 can be programmed to store logical zero or remain erased to store logic one. During an erasure operation, each of memory cells 80–88 is erased to store the logical one data. Memory array 50 then can be reprogrammed.

Referring back to FIG. 3, flash EPROM 30 includes an X decoder 38 and a Y decoder 37. X decoder 38 is the row decoder for memory array 50. X decoder 38 is coupled to the word lines of memory array 50. X decoder 38 receives X addresses via address bus 43. X decoder 38 selects one word line in accordance with each of the X addresses provided via bus 43 to undergo read or programming operation.

Y decoder 37 is coupled, via Y gating 33, to the bit lines of memory array 50. Y decoder 37 receives Y addresses via address bus 43. For one embodiment, Y decoder 37 selects one byte of bit lines (i.e., 8 bit lines) for each of the addresses applied in one of the read and programming operations. For another embodiment, Y decoder 37 selects one word of bit lines (i.e., 16 bit lines) for each of the Y addresses applied in one of the read and programming operations. Y gating 33 is also coupled to a sense amplifier 32 via bus 41 and an input buffer 31 via bus 42.

Flash EPROM 30 also includes a drain voltage switch 36, a gate voltage switch 35, and a source voltage switch 34. Source voltage switch selectively couples one of a high erasure voltage $V_{PP}$ and a ground voltage $V_{SS}$ to the source of each of the memory cells in memory array 50 via line 53, depending on the device operation of flash EPROM 30. Line 53 is connected to the common source line of memory array 50. Source voltage switch 34 is controlled by a control logic 39 via line 46 to selectively couple one of the $V_{PP}$ and $V_{SS}$ voltages to the source of each of the memory cells of memory array 50.

Drain voltage switch 36 selectively couples one of a read voltage $V_R$, the $V_{SS}$ voltage, and a programming drain voltage $V_P$, $V_R$ to the selected bit lines via Y decoder 37 and via line 51, depending on the device operation of flash EPROM 30. Drain voltage switch 36 is controlled by control logic 39 via line 44 to selectively couple one of the $V_P$, $V_R$ and $V_{SS}$ voltages to the selected bit lines. As described above, Y decoder 37 selects the selected bit lines.

Gate voltage switch 35 selectively couples one of the $V_{SS}$ voltage, the $V_{CC}$ voltage, a programming gate voltage $V_{PP}$, and an equalization programming gate voltage $V_{EG}$ to the selected word line via X decoder 38, depending on the device operation of flash EPROM 30. Gate voltage switch 35 is controlled by control logic 39 via line 46. As described above, X decoder 38 selects the selected word line.

The device operation of flash EPROM 30 includes read, programming, and erasure operations. According to one embodiment of the present invention, the memory cells of memory array 50 each has approximately the same final erased threshold voltage after the erasure operation. In addition, the uniform final erased threshold voltage of each of the memory cells is a positive voltage. Moreover, the final erased threshold voltage for each of the memory cells of memory array 50 is precisely controlled.

The erasure operation, according to one embodiment of the present invention, includes a deep erasure operation and a subsequent equalization programming operation. During the deep erasure operation, each of the memory cells of memory array 50 is sufficiently erased such that the erased threshold voltage of each of the memory cells is below a predetermined threshold voltage. In this case, some or all of the memory cells of memory array 50 may be overerased during the deep erasure operation to have a negative threshold voltage. Moreover, the erased threshold voltage of each of the memory cells of memory array 50 also varies from cell to cell below the predetermined threshold voltage after the deep erasure operation.

Figure 4:
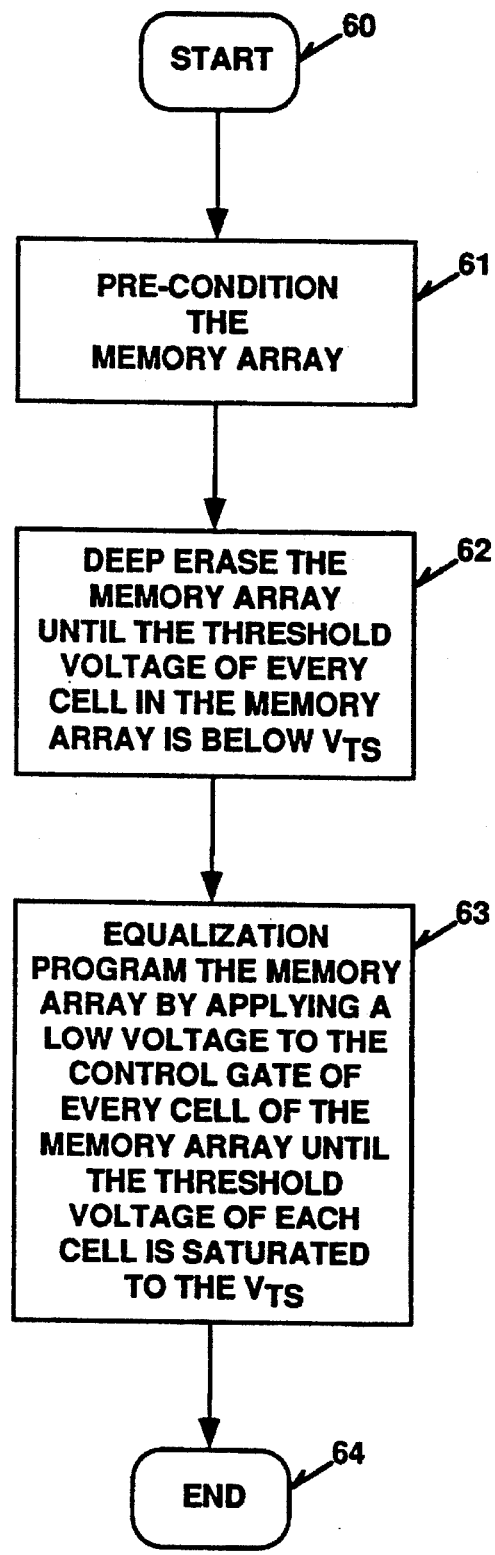
FIG. 4 is a flow chart that shows the process of preventing the flash EPROM of FIG. 3 from being overerased.
Figure 6:
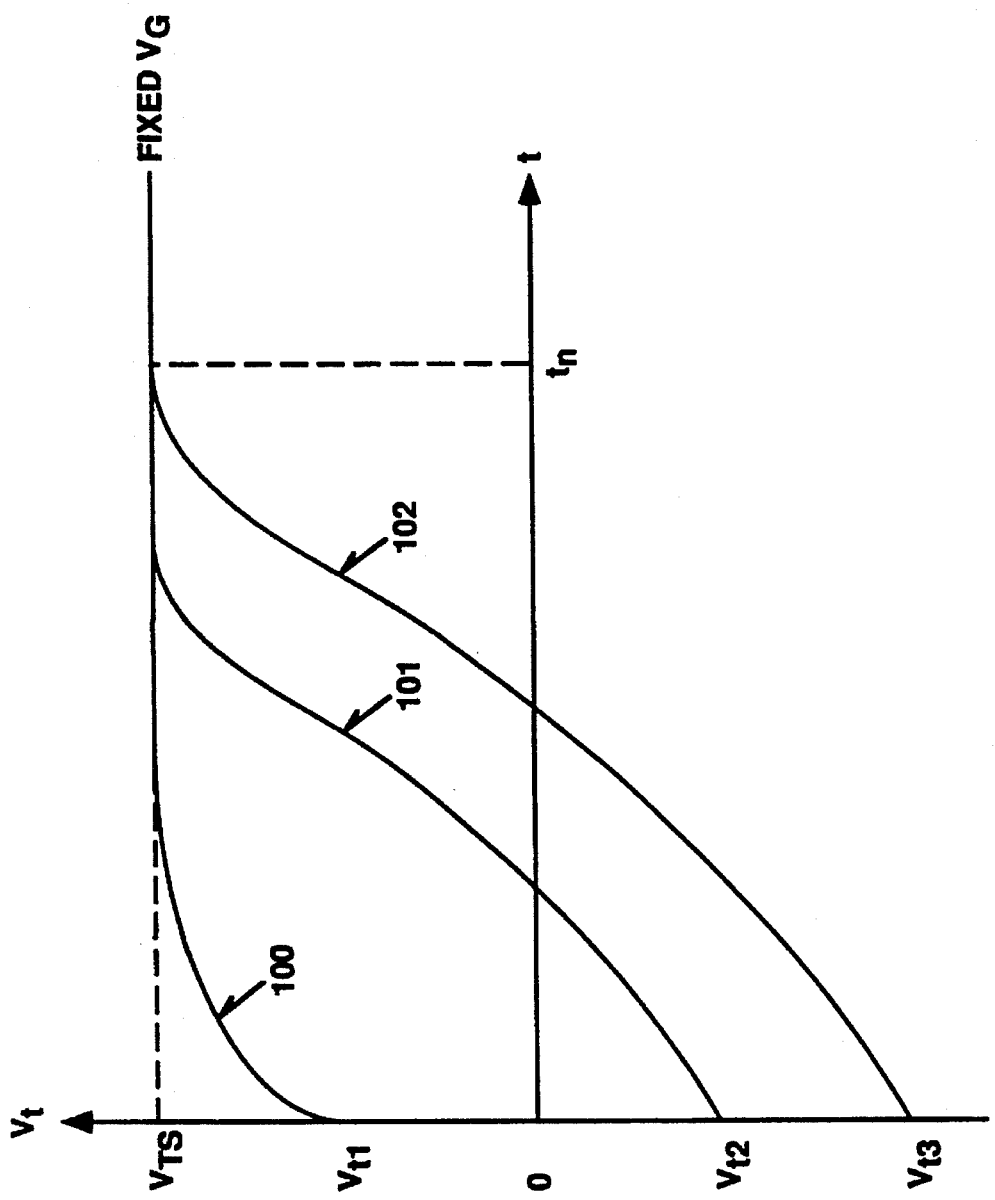
FIG. 6 illustrates the waveforms of the threshold voltages of three memory cells within the memory array of FIG. 5B during equalization programming.

During the subsequent equalization programming operation, the equalization programming gate voltage $V_{EG}$ is applied to program the threshold voltage of each of the memory cells of memory array 50 to the predetermined threshold voltage. As described above, the saturated threshold voltage of a memory cell during programming is solely determined by the programming gate voltage applied at its control gate. Therefore, the equalization programming gate voltage $V_{EG}$ determines the threshold voltage of each of the memory cells of memory array 50 during the equalization programming operation, regardless of the initial threshold voltage state of each of the memory cells of memory array 50 after the deep erasure operation below the predetermined threshold voltage. For example, when the $V_{EG}$ voltage can program a memory cell to have the predetermined threshold voltage, each of the memory cells of memory array 50 will have a saturated threshold voltage which is equal to the predetermined threshold voltage when the $V_{EG}$ voltage is applied to the control gate of each of the memory cells of memory array 50. In this case, the equalization programming gate voltage $V_{EG}$ will cause the threshold voltage of each of the memory cells of memory array 30 to be saturated to the predetermined threshold voltage from various initial erased threshold voltages below the predetermined threshold voltage. Therefore, each of the memory cells of memory array 50 will have the same predetermined threshold voltage after the erasure operation. Moreover, any possible overerasure to the memory cells of memory array 50 will be eliminated by the equalization programming operation. Furthermore, the threshold voltage for each of the memory cells of memory array 50 is precisely controlled. FIG. 4 illustrates the sequence of the erasure operation in accordance with one embodiment of the present invention, which will be described below in more detail. In addition, FIG. 6 illustrates that memory cells of different initial threshold voltages resulted from the deep erasure operation will be saturated to have the same predetermined threshold voltage during the equalization programming operation, which will also be described below.

Referring again to FIG. 3, for one embodiment, the equalization programming gate voltage $V_{EG}$ is 3.5 volts. For this embodiment, the threshold voltage of each of the memory cells of memory array 50 is programmed to approximately 0.7 volts. For another embodiment, the equalization programming gate voltage $V_{EG}$ is 4 volts. For this embodiment, the threshold voltage of each of the memory cells of memory array 50 is programmed to approximately 1.2 volts.

Control logic 39 controls the device operation of flash EPROM 30. Control logic 39 receives device operation commands from external microprocessor (not shown) via bus 47. Control logic 39 includes state circuitry (not shown) for generating control signals and timing signals to voltage switches 34–36 via lines 44–46 and decoders 37 and 38 via line 48. Control logic 39 also includes registers (not shown) for storing and decoding the commands received from bus 47. The function of control logic 39 with respect to the device operation of flash EPROM 30 will be described in more detail below, also in conjunction with FIGS. 4–6.

$V_{PP}$ is the erasure/programming voltage for flash EPROM 30. $V_{CC}$ is the device power supply for flash EPROM 30 and $V_{SS}$ is ground. For one embodiment, $V_{PP}$ is approximately 12.0 volts and $V_{CC}$ is approximately 5.0 volts. For another embodiment, $V_{CC}$ is approximately 3 volts.

Device operations of flash EPROM 30, such as read, programming, or erasure, are selected by writing specific commands into control logic 39. The commands may include erase command, program command, and read command, etc.

In the absence of the high $V_{PP}$ voltage on the $V_{PP}$ pin of flash EPROM 30, control logic 39 is defaulted to the read operation and the device acts as a read-only memory. The data stored at an address supplied via address bus 43 and decoded by X and Y decoders 38 and 37 is read from memory array 50 and made available through sense amplifier 32 to circuitry external to flash EPROM 30 via bus 40. While $V_{PP}$ is high for erasure and programming of flash EPROM 30, memory array 50 can be accessed by erase or program command.

During the read operation of flash EPROM 30, addresses are applied to X and Y decoders 38 and 37. X decoder 38 selects one word line for any X address applied and Y decoder 37 selects one byte or one word of bit lines for any Y address applied. Control logic 39 controls gate voltage switch 35 to couple the $V_{CC}$ voltage to the selected word line via X decoder 38. Control logic 39 also controls drain voltage switch 36 to couple the $V_R$ voltage to the selected bit lines via Y decoder 37 and source voltage switch 34 to couple the $V_{SS}$ voltage to the source of each of the memory cells of memory array 50. $V_R$ is the read voltage applied to the selected memory cells of memory array 50 during read operation. Data is then read from the selected memory cells along the selected word line and selected bit lines through sense amplifier 32 and is supplied to the external circuitry via bus 40.

During the programming operation of flash EPROM 30, the $V_{PP}$ pin of flash EPROM 30 receives the high $V_{PP}$ voltage and control logic 39 receives a program command. Addresses are applied to X and Y decoders 38 and 37. X decoder 38 selects one word line for any X address applied. Y decoder 37 selects one word or one byte of bit lines for any Y address applied. Control logic 39 then causes gate voltage switch 35 to couple the programming gate voltage $V_{PP}$ to the selected word line via X decoder 38 and drain voltage switch 36 to couple the programming drain voltage $V_P$ to the selected bit lines via Y decoder 37. Control logic 39 also causes source voltage switch 34 to couple the $V_{SS}$ voltage to the source of each of the memory cells in memory array 50. The selected memory cells along the selected word line have their control gates coupled to the $V_{PP}$ voltage. The selected memory cells along the selected bit lines selectively have their drains coupled to the $V_P$ voltage. Which of the selected memory cells have their drains coupled to the $V_P$ voltage depends on the data to be programmed. If a selected memory cell along a selected bit line is to be programmed to a logical one data, the $V_P$ voltage is applied. If, however, the selected memory cell along the selected bit line is to be programmed to a logical zero data, the $V_{SS}$ voltage is applied to the selected bit line.

As described above, the erasure operation of flash EPROM 30 requires two separate operations, namely a deep erasure operation and an equalization programming operation, according to one embodiment of the present invention. For one embodiment, the memory cells of memory array 50 is pre-conditioned before the deep erasure operation. Control logic 39 controls the sequence of these operations of the erasure operation. The pre-conditioning operation is performed to program all the memory cells within memory array 50 that are not in the programmed state before the deep erasure operation. For another embodiment, the preconditioning operation is not performed.

The deep erasure operation is performed to ensure that the erased threshold voltage of each of the memory cells of memory array 50 is below a predetermined threshold voltage. The equalization programming operation is performed subsequent to the deep erasure operation to uniformly program the erased threshold voltage of each of the memory cells of memory array 50 to the predetermined threshold voltage such that overerasure of any of the memory cells during the deep erasure operation is eliminated and a final uniformly low threshold voltage for each of the memory cells is obtained.

The erasure operation in accordance with one embodiment of the present invention is described in conjunction with FIGS. 3–6. As seen in FIG. 4, the erasure operation starts at step 60 at which control logic 39 of FIG. 3 receives an erase command and the $V_{PP}$ pin of flash EPROM 30 receives the $V_{PP}$ voltage. At step 61, the memory cells of memory array 50 (FIG. 3) are pre-conditioned to cause every cell of memory array 50 to be programmed. Control logic 39 controls the pre-conditioning operation. Control logic 39 causes X and Y decoders 38 and 37 to select all the memory cells of memory array 50 that are not programmed. Control logic 39 also controls switches 34–36 to apply the programming voltages to those unprogrammed cells in memory array 50. Once the pre-conditioning operation is complete, all of the memory cells of memory array 50 are programmed.

The erasure operation then goes to the next step (i.e., step 62) at which the memory cells of memory array 50 are deeply erased. This deep erasure operation is also controlled by control logic 39. Control logic 39 causes gate voltage switch 35 to apply the $V_{SS}$ voltage to all the word lines of memory array 50 via X decoder 38, and causes source voltage switch 34 to apply the $V_{PP}$ voltage to the common source line of memory array 50. The bit lines of memory array 50 are left floating. FIG. 5A schematically illustrates the voltages applied to memory array 50 during deep erasing.

Alternatively, the deep erasure operation at step 62 can be achieved by applying a negative high erasure voltage (e.g., $-V_{PP}$) to the word lines of memory array 50 and a positive voltage (e.g., $V_{CC}$) to the common source line of memory array 50. The bit lines of memory array 50 are coupled to the $V_{SS}$ voltage. FIG. 5C schematically illustrates the voltages applied to memory array 50 during deep erasing, according to the alternative embodiment.

In this alternative embodiment of deep erasing memory array 50, the positive voltage applied to the common source line of memory array 50 can be the $V_{SS}$ voltage and the bit lines of memory array 50 may be left floating during the deep erasure operation.

Control logic 39 causes voltage switches 34 and 35 to apply the erasure voltages to memory array 50, respectively, during the deep erasure operation for sufficiently long time such that the threshold voltage of each of the memory cells of memory array 50 is below a predetermined threshold voltage $V_{TS}$. As described above, the predetermined threshold voltage $V_{TS}$ is the threshold voltage of each of the memory cells of memory array 50 after the subsequent equalization programming operation. Therefore, if the predetermined threshold voltage $V_{TS}$ is set at 0.7 volts, each of the memory cells of memory array 50 is then required to be erased to have an erased threshold voltage lower than 0.7 volts during the deep erasure operation. In other words, control logic 39 causes the $V_{SS}$ and $V_{PP}$ voltages to be applied to memory array 50 until after the threshold voltage of each of the memory cells of memory array 50 is below 0.7 volts. If the predetermined threshold voltage $V_{TS}$ is set at 1 volt, the deep erasure operation will cause the threshold voltage of each of the memory cells of memory array 50 to be below 1 volt.

After the deep erasure operation, each of the memory cells of memory array 50 has its erased threshold voltage below the predetermined threshold voltage $V_{TS}$. However, the erased threshold voltage of each of the memory cells of memory array 50 varies from memory cell to memory cell and may even below zero volts.

The erasure operation then goes to the next step (i.e., step 63). At step 63, flash EPROM 30 of FIG. 3 undergoes the equalization programming operation. As described above, the equalization programming operation allows each of the memory cells of memory array 50 to have the predetermined threshold voltage uniformly. This is achieved even if some of the memory cells have been overerased to have a negative threshold voltage during the previous deep erasure operation. FIG. 6 schematically illustrates the threshold voltage evolutions 100 through 102 of three of the memory cells of memory array 50, respectively. As can be seen from FIG. 6, curves 100–102 each starts from a different initial threshold voltage. Curve 100 starts from a $V_{t1}$ threshold voltage which is between zero volts and the predetermined threshold voltage $T_{TS}$. Curve 101 starts from a $V_{t2}$ threshold voltage which is below zero volts. Curve 102 starts from a $V_{t3}$ threshold voltage which is below the $V_{t2}$ voltage. As can be seen from FIG. 6, curves 100–102 all reach the $V_{TS}$ voltage after $t_n$ timing. In other words, the threshold voltage for each memory cell is saturated to the $V_{TS}$ voltage during the equalization programming operation.

Referring to FIGS. 3–4, 5B, and 6, during the equalization programming operation, control logic 39 causes source voltage switch 34 to apply the $V_{SS}$ voltage to the source of each of the memory cells of memory array 50. Control logic 39 causes gate voltage switch 35 to apply the equalization programming gate voltage $V_{EG}$ to all the word lines of memory array 50 and causes drain voltage switch 36 to couple the programming drain voltage $V_P$ to all the bit lines of memory array 50. FIG. 5B shows the $V_{SS}$, $V_{EG}$, and $V_P$ voltages applied to memory array 50 during the equalization programming operation.

Control logic 39 controls switches 34–36 to constantly apply the $V_{SS}$, $V_{EG}$, and $V_P$ voltages to memory array 50 until the threshold voltage of each of the memory cells of memory array 50 is saturated to the predetermined threshold voltage $V_{TS}$, as shown in FIG. 6.

The erasure operation is then ended at step 64. At this time, each of the memory cells of memory array 50 is "erased" to the predetermined threshold voltage $V_{TS}$ uniformly.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for eliminating overerasure in a nonvolatile memory during erasure, wherein the nonvolatile memory includes a plurality of memory cells, each having a control gate, a floating gate, a drain, and a source, wherein the method comprises the steps of:

(A) erasing the nonvolatile memory until each of the memory cells has a threshold voltage at or below a predetermined voltage state;

(B) programming the nonvolatile memory by applying (1) an equalization programming voltage to the control gate of each of the memory cells and (2) voltages to the drain and source of each of the memory cells to cause the threshold voltage of each of the memory cells to be programmed to the predetermined voltage state, wherein the equalization programming voltage determines the predetermined voltage state and the voltage applied to the drain of each of the memory cells is positive relative to the voltage applied to the source of the respective memory cell.

2. The method of claim 1, wherein the equalization programming voltage is approximately 3.5 volts.

3. The method of claim 1, wherein the voltage applied to drain of each of the memory cells is a positive voltage and the voltage applied to source of each of the memory cells is ground.

4. The method of claim 1, wherein the threshold voltage of each of the memory cells is saturated to the predetermined voltage state at the step (B).

5. The method of claim 1, wherein the step (A) further comprises the step of pre-conditioning the nonvolatile memory by selectively programming some of the memory cells such that each of the memory cells is in a programmed state before erasing the nonvolatile memory.

6. The method of claim 1, wherein the step (A) further comprises the steps of (1) applying a negative voltage to the control gate of each of the memory cells;

(2) applying a positive voltage to the source of each of the memory cells.

7. The method of claim 6, wherein the negative voltage is approximately −12 volts and the positive voltage applied at the source of each of the memory cells is approximately 5 volts.

8. The method of claim 1, wherein the step (A) further comprises the steps of (1) applying ground to the control gate of each of the memory cells;

(2) applying a positive voltage to the source of each of the memory cells.

9. An apparatus for eliminating, during erasure, overerasure in a nonvolatile memory that includes a plurality of memory cells, each having a control gate, a floating gate, a drain, and a source, comprising:

(A) first circuitry coupled to said plurality of memory cells, said first circuitry for erasing the nonvolatile memory until each of the memory cells has a threshold voltage at or below a predetermined voltage state;

(B) second circuitry coupled to said plurality of memory cells, said second circuitry for performing an equalization programming operation to the nonvolatile memory after erasure, said second circuitry having (i) an equalization programming voltage generator coupled to the control gate of each of the memory cells;

(ii) circuitry coupled to the drain and source of each of the memory cells for applying voltages to the drain and source of each of the memory cells such that the threshold voltage of each of the memory cells is programmed to the predetermined voltage state, wherein the equalization programming voltage determines the predetermined voltage state and the voltage applied to the drain of each of the memory cells is positive relative to the voltage applied to the source of the respective memory cell.

10. The apparatus of claim 9, wherein the threshold voltage of each of the memory cells is saturated to the predetermined voltage state during the equalization programming operation.

11. The apparatus of claim 10, wherein the equalization programming voltage is approximately 3.5 volts.

12. The apparatus of claim 11, wherein the voltage applied to drain of each of the memory cells is a positive voltage and the voltage applied to source of each of the memory cells is ground.

13. The apparatus of claim 9, further comprising third circuitry coupled to said plurality of memory cells for pre-conditioning the nonvolatile memory by selectively programming some of the memory cells before erasing such that each of the memory cells is in a programmed state.

14. The apparatus of claim 9, further comprising (1) circuitry for applying a negative voltage to the control gate of each of the memory cells;

(2) circuitry for applying a positive voltage to the source of each of the memory cells.

15. The apparatus of claim 9, further comprising (1) circuitry for applying ground to the control gate of each of the memory cells;

(2) circuitry for applying a positive voltage to the source of each of the memory cells.

16. A method for eliminating overerasure in a nonvolatile memory during erasure, wherein the nonvolatile memory includes a plurality of memory cells having a control gate, a floating gate, a drain, and a source, wherein the method comprises the steps of:

(A) performing a deep erasing of the nonvolatile memory, at least a subset of said plurality of the memory cells having threshold voltages which are substantially different from a predetermined voltage stage;

(B) performing an equalization programming of the nonvolatile memory by applying (1) an equalization programming voltage to the control gate of each of the memory cells and (2) voltages to the drain and source of each of the memory cells to cause the threshold voltage of each of the memory cells be programmed to the predetermined voltage state, wherein the equalization programming voltage determines the predetermined voltage state and the voltages applied to the drain and the source of each of the memory cells is such that a current flows between the source and drain of the respective memory cell.

17. The method of claim 16, wherein the equalization programming voltage is approximately 3.5 volts.

18. The method of claim 16, wherein the voltage applied to drain of each of the memory cells is a positive voltage and the voltage applied to source of each of the memory cells is ground.

19. The method of claim 16, wherein the threshold voltage of each of the memory cells is saturated to the predetermined voltage state at the step (B).

20. The method of claim 16, wherein the step (A) further comprises the step of pre-conditioning the nonvolatile memory by selectively programming some of the memory cells such that each of the memory cells is in a programmed state before erasing the nonvolatile memory.

21. The method of claim 16, wherein the step (A) further comprises the steps of (1) applying a negative voltage to the control gate of each of the memory cells;

(2) applying a positive voltage to the source of each of the memory cells.

22. The method of claim 21, wherein the negative voltage is approximately −12 volts and the positive voltage applied at the source of each of the memory cells is approximately 5 volts.

* * * * *